(12) United States Patent
Hovel

(10) Patent No.: US 6,429,145 B1
(45) Date of Patent: Aug. 6, 2002

(54) METHOD OF DETERMINING ELECTRICAL PROPERTIES OF SILICON-ON-INSULATOR WAFERS

(75) Inventor: Harold J. Hovel, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 09/770,955

(22) Filed: Jan. 26, 2001

(51) Int. Cl.[7] .............................................. H01L 21/302
(52) U.S. Cl. ......................................... 438/745; 438/14
(58) Field of Search ........................... 438/745, 14, 15, 438/16, 687, 692; 257/913, 679

(56) References Cited

U.S. PATENT DOCUMENTS

| | | | |
|---|---|---|---|
| 5,991,225 A | * 11/1999 | Forbes et al. | 365/230.06 |
| 6,093,577 A | * 7/2000 | van der Groen et al. | 430/30 |
| 6,110,278 A | * 8/2000 | Saxena | 117/95 |
| 6,153,043 A | * 11/2000 | Edelstein et al. | 156/345 |
| 6,251,787 B1 | * 6/2001 | Edelstein et al. | 438/692 |
| 6,297,155 B1 | * 10/2001 | Simpson et al. | 438/687 |
| 2002/0024152 A1 | * 2/2002 | Momoi et al. | 257/913 |
| 2002/0027274 A1 | * 3/2002 | Usami et al. | 257/679 |

OTHER PUBLICATIONS

Cristoloveanu et al., *IEEE Elect. Dev. Letters*, 13, Nos., 102–104, Feb. 1992.
Hovel, Pros. *1999 IEEE Inter. SOI Conf.* 180–181, (Oct. 1997).
D. Munteanu et al., *Electrochem. and Solid–State Letters*, 2 (5), 242–243 (1999).

* cited by examiner

Primary Examiner—John F. Niebling
Assistant Examiner—Olivia T. Luk
(74) *Attorney, Agent, or Firm*—Scully, scott, Murphy & Presser; Robert M. Trepp

(57) ABSTRACT

A method of determining electrical parameters of a silicon-on-insulator wafer. In this method a native oxide of a silicon layer on a silicon-on-insulator substrate is removed from a silicon mesa formed on the silicon layer. The mesa is contacted with two liquid metal electrodes. A voltage is applied to an electrode on the bottom of the silicon-on-insulator wafer. The current between the two liquid metal electrodes is measured for a combination of voltages between the liquid metal electrodes and the bottom voltage. The resulting current-voltage behavior is analyzed to obtain parameters of mobility, charge in the buried oxide of the silicon-on-insulator substrate, interface state charge, threshold voltages in the linear and saturated regions, doping density, transconductances and output conductances.

10 Claims, 2 Drawing Sheets

METHOD OF DETERMINING ELECTRICAL PROPERTIES OF SILICON-ON-INSULATOR WAFERS

BACKGROUND OF THE DISCLOSURE

1. Field of the Invention

The present invention is directed to a method of determining electrical properties of silicon-on-insulator wafers. More specifically, the present invention is drawn to a method of determining silicon-on-insulator wafer electrical properties by measuring electrical properties of the silicon-on-insulator between two electrodes and analyzing resulting electrical properties after imposing a voltage thereon.

2. Background of the Prior Art

Silicon-on-insulator (SOI) starting substrate material can be used as an alternative to standard silicon wafers ("bulk silicon") to produce integrated circuits. Quality control of starting SOI wafers is necessary because such wafers are produced in "batch" processes which can have variability in defect densities, interface perfection, and contamination. The electrical properties, such as electron and hole mobilities, surface state densities, fixed charge densities, and surface scattering properties, in part determine how well a field effect transistor (FET) will perform when this starting material is processed into integrated circuits. One method for assessing these starting wafer properties is to build FETs in the material using standard device processes like ion implantation, annealing, oxidation or diffusion, which are costly and time consuming. An alternative is to use the buried oxide in the SOI structure as a gate oxide, place two electrodes on the Si surface as source and drain contacts, and use this as a "pseudo-FET." Electrical measurements using such pseudo-FETs have been described in, for example, *IEEE Electron Device Letters,* Vol 13, pg 102, 1992 and in *Electrical Characterization of Silicon-on-Insulator Materials and Devices,* Kluwer Academic Publishers, Boston, 1995. Similar measurements made using mercury electrodes have been described in *Proc. 1997 IEEE International SOI Conference,* pg 180, and in *Electrochemical and Solid State Letters,* 2, 242, 1999). However, all this prior art fails to present details on how these test structures are best made, how to account for the parasitic effects which limit their usefulness and how to set the correct voltage conditions for correct measurements. Moreover, these references do not present a complete mathematical analysis needed to obtain electrical properties.

SUMMARY OF THE INVENTION

A new method has now been developed for providing electrical properties of silicon-on-insulator wafers which accounts for parasitic effects, sets the correct voltage conditions for correct measurement and, in summary, provides means for obtaining electrical properties of the SOI wafer.

An electrical test structure of the present invention is made by depositing a doping metal, such as aluminum, to provide an Al/Si interface, on the back of a SOI wafer, heat treating the wafer to convert the Al/Si interface to an ohmic contact, masking a mesa on the top Si surface, removing the Si layer outside of this masked mesa, treating the remaining Si surface in an etchant, contacting this surface with two or more mercury electrodes to act as source and drain of a FET, applying voltages between the source and drain, applying a second voltage between the bottom aluminum layer and the source electrode, and varying these voltages appropriately to obtain field effect transistor current-voltage behavior, choosing the correct voltage range depending on the thicknesses of the Si and buried oxide layers, repeating the measurements at several time periods until steady state behavior is obtained, applying mathematical analysis to the data in order to extract the electrical parameters and correcting for parasitic effects and other measurement variability. Liquid metals other than mercury, such as gallium mixed with indium, tin or combinations of mercury with other metals such that the mixture is liquid at room temperature may also be used. Alternatively, metals such as Al, Ag, Au, Sn, and others may be evaporated onto the Si surface to act as source and drain electrodes in solid rather than liquid form.

BRIEF DESCRIPTION OF THE DRAWINGS

The present invention may be better understood by reference to following drawings of which.

DETAILED DESCRIPTION

Figure 1:
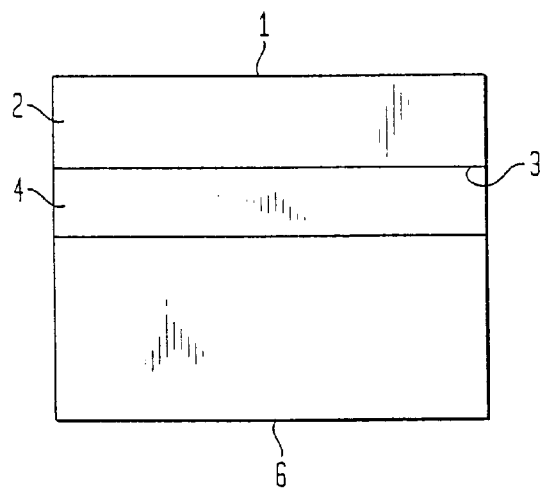
FIG. 1 is an schematic representation of a silicon-on-insulator structure.

Silicon on insulator (SOI) wafers used for fabricating integrated circuits have the general features shown in FIG. 1. An SOI includes a bulk silicon substrate 5, a buried oxide layer (BOX) 4, an insulating layer, usually silicon dioxide, disposed above the substrate 5, a crystalline Si layer 2, disposed over the BOX 4 and a bottom surface 6 of the substrate 5. The interface between the silicon layer 2 and the buried oxide layer 4 is denoted by reference numeral 3. Furthermore, the top surface of the silicon layer 2 is represented by reference numeral 1. For complementary metal oxide semiconductor (CMOS) integrated circuits, typical thicknesses for the BOX layer 4 range from about 50 nanometers (nm) to about 400 nm while typical silicon layer thicknesses range from about 50 mn to about 250 mm. Other applications may use BOX and silicon thicknesses as much as ten times these values.

Figure 2:
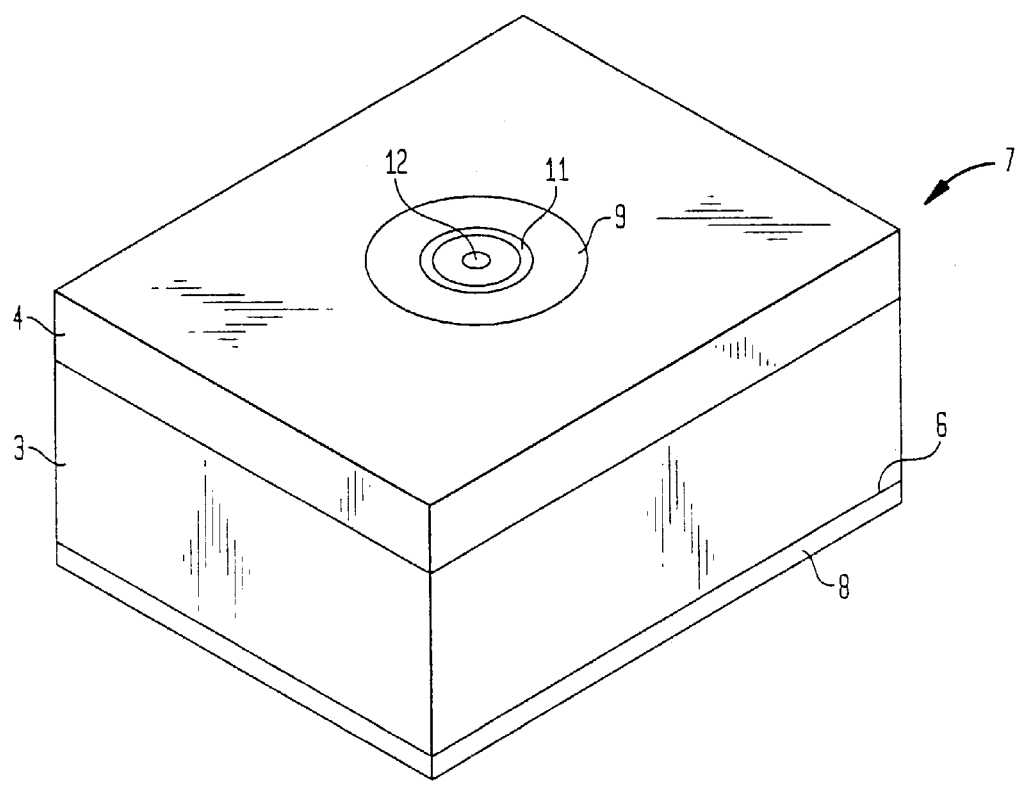
FIG. 2 is an isometric view of the test structure of the present invention.

The BOX 4 serves as a gate oxide for fabricating an FET where the "gate" voltage is applied to the bottom surface 6 of the substrate 5 and two electrodes, acting as source and drain, are applied to the top surface 1. FIG. 2 shows a test sample 7 prepared to perform electrical measurements. The size of the test sample 7 is flexible; it can be an entire wafer or a small piece cut from a wafer. In order to prevent an undesirable Schottky barrier on the bottom surface that would detract from the FET operation, an aluminum (Al) layer 8 is deposited onto the bottom surface 6. Such deposition may be by evaporation, sputtering or other applicable process. The surface 6 is first treated with hydrofluoric acid (HF), to remove any unwanted "native oxide." A mesa 9 is then formed on the surface 1 whereby the mesa 9 represents the unetched, i.e. unremoved, silicon layer. The top surface 10 of the BOX 4 layer is shown with the silicon layer 2 completely removed. The top surface 10 is equivalent to the position 3, defining the interface between the silicon layer 2 and the buried oxide layer 4. This mesa etching step prevents the formation of a very deleterious parasitic current leakage path between the silicon layer 2 and the substrate 5. As those skilled in the art are aware, parasitic current leakage paths greatly hinder proper FET measurements, especially for thinner buried oxides. The mesa etching is conducted using an etch which dissolves silicon. Particularly preferred etches include potassium hydroxide (KOH), mixtures of nitric acid with HF and water and acetic acid.

The sample 7 is placed in a heating source, such as a furnace or Rapid Thermal Annealer. The heating source is provided in a non-reacting atmosphere, such as nitrogen or a forming gas which is a mixture of nitrogen and hydrogen. The sample 7 is heated to a temperature sufficient to convert the aluminum layer 8 into a low resistance ohmic contact. The formation of the ohmic contract prevents another deleterious parasitic effect due to unwanted applied voltage drop across bottom surface 6. Heating is conducted at a temperature preferably in the range of between about 500° C. to about 600° C. The duration of heating ranges from about 5 seconds for the higher temperature to about several minutes if heating is conducted at the low end of this temperature range. The heating step may be carried out either before or after mesa etching has been carried out.

To begin electrical measurements used to determine electrical parameters, the silicon surface of the mesa 9 is brought into contact with an etchant, preferably a hydrofluoric acid/water solution, for a time period of at least several seconds and rinsed with water or another aqueous solution such as an alcoholic solution to remove the acid mixture. The purpose of the etchant treatment is to remove the native oxide and surface states which are normally present on an untreated silicon surface and which hinder FET behavior. The rinsed surface is then blown dry with a gas stream, such as $N_2$, forming gas (a mixture of $N_2/H_2$), or compressed air. The sample is then loaded onto a test apparatus and two electrodes 11 and 12 of a liquid metal are brought into contact with the silicon surface of the mesa 9.

The liquid metal forming electrodes 11 and 12 is preferably mercury, gallium mixed with indium, tin or mercury combined with at least one metal such that the mixture is liquid at ambient temperature. Of these, liquid mercury is most preferred. The drain voltage, drain current, and gate voltage are then applied to obtain FET behavior which result in obtaining desired electrical parameters.

Figure 3:
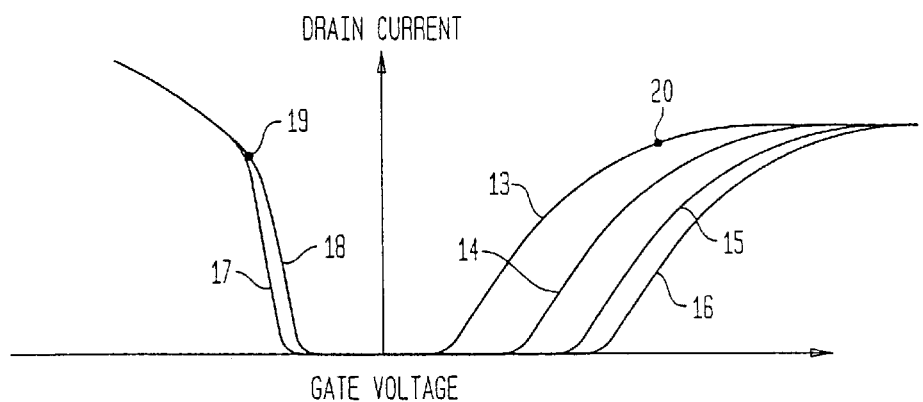
FIG. 3 graphically depicts drain current as a function of gate voltage at several times after the measurement sequence has been started in accordance with the present invention.

An example of such FET behavior is illustrated by FIG. 3. Therein, drain current, measured between electrodes 11 and 12, is plotted as a function of gate voltage applied to the electrode formed by aluminum layer 8. The larger diameter electrode 11 is often used as the "source" electrode of the FET and the smaller diameter electrode 12 is used as the "drain" electrode. This configuration is chosen because the electrodes 11 and 12 do not form low resistance contacts to the silicon film but rather act as diodes and, using the larger electrode 11 as the source contact, reduces parasitic series resistance. The curves denoted by reference numerals 13, 14, 15, and 16 are measured for positive gate voltages applied to electrode 8 and are for increasing periods of time after the start of the measurement. The curves denoted as 17 and 18 are for negative gate voltages at two different times after start of the measurement. Curves 13 to 16 represent results in cases where an "inversion layer" of electrons forms a conducting channel between electrodes 11 and 12 while curves 17 and 18 represent results in cases where an "accumulation layer" of holes forms the conducting channel. This terminology is used to describe FETs where the region in which the conducting channel forms is normally p-type when no voltages are applied. For n-type material, the accumulation layer occurs for positive gate voltages and the inversion layer for negative voltages. The drain voltage, applied between electrode 11 and 12, during the measurement can be, typically, between about 50 and about 200 millivolts, while the gate voltage applied to electrode 8 is varied from a largest negative value to a largest positive value, each such value depending on the thicknesses of the BOX layer 4 and silicon layer 2 and the voltages at which the "knees" 19 and 20 occur. For buried oxides greater than 300 nm thick, with Si layer thicknesses greater than 100 nm, the gate voltage is varied from, typically, about −15 volts to about +15 volts. For buried oxides of about 100 nm and Si layer thicknesses greater than about 100 nm, the gate voltage is varied, typically, from about −7 to about +11 volts. However, for thin silicon films, i.e. less than 100 nm, the positive voltage value must be increased, to about +15 volts for 50 nm Si films. This is necessary in order to have a sufficient voltage range for correctly determining silicon film electrical parameters. The method of determining the largest negative and positive gate voltages necessary for correct measurement is to ensure that the largest applied negative voltage is at least 5 volts more negative than knee 19 and the largest applied positive voltage is at least 6 volts greater than knee 20.

When test sample 7 was contacted by mercury electrodes 11 and 12 just after hydrofluoric acid surface treatment and gate and drain voltages were applied, the curves labeled 17 and 13 were obtained. When the measurements were repeated at a later time, for example 10 minutes later, curve 14 was obtained while curve 17 did not change significantly. When the measurements were again repeated after, for example, 1 hour and 2 hours, curves 15 and 16, respectively, were obtained in the positive gate voltage direction and the accumulation curve for negative gate voltage shifted very slightly to become curve 18. These changes over time are caused by positively charged ions, for example, hydrogen ions of a hydrogen-fluorine ion combination, which are deposited on the Si layer surface 1 of mesa 9 by the HF surface treatment. The ions "leak" off over time, changing the electric field pattern in the Si layer 2 of the mesa 9 of test sample 7. As the ions dissipate, the curves reach a steady state and become constant; however, while the accumulation curve 18 reaches a constant useful value after several hours, the inversion curves, such as curve 16, is reduced in amplitude as the Hg electrode contacts become higher in resistance and the resulting parasitic resistance voltage loss causes the inversion curves, such as curve 16, to be less valuable. Therefore, the inversion curves, such as curve 16, obtained no more than about 60 minutes after HF treatment, are analyzed mathematically for electron properties while the accumulation curves, such as 18, obtained several hours after HF treatment, are analyzed for hole properties.

Figure 4:
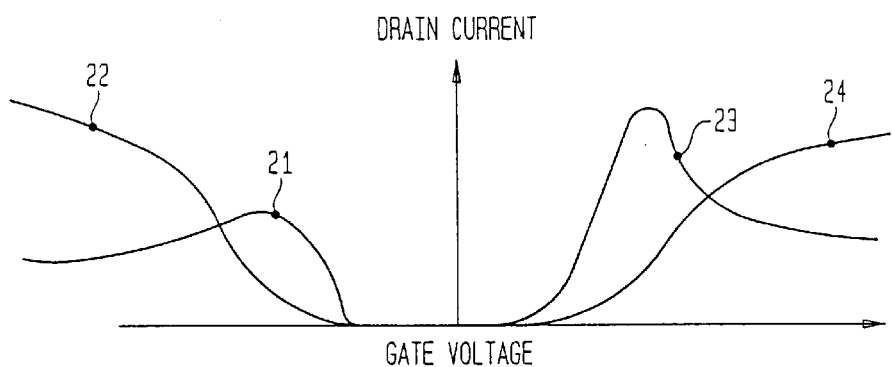
FIG. 4. is a graphic plot of transconductance and the transfer curve equal to the drain current divided by the square root of the transconductance.

An example of several curves used to extract electrical properties is shown in FIG. 4. Curve 21 is the transconductance in the accumulation direction, given by: $G_m=(dI_{DS}/dV_G)$, where $I_{DS}$ is the drain current; and $V_G$ is the gate voltage, obtained using the current and the voltage values of curve 18; and the letter d denotes differentiation in calculus mathematics. Curve 22 is called the transfer characteristic given by: $G_T=I_{DS}/G_M^{1/2}$. The electrical parameter known as the accumulation threshold voltage is obtained by extrapolating the drain current 18 to zero current around the gate voltages at the peak of transconductance 21; the intercept is the accumulation threshold voltage, which is also equal to the "flatband" voltage $V_{FB}$ of the FET. The flatband voltage is used to determine the charge density located in the BOX 4 by: $QBOX=(V_{FB}+0.75)(C_{OX}/Q)$, where QBOX is the charge in the buried oxide; $C_{OX}$ is the buried oxide capacitance, Q is the electron charge equal to $1.602 \times 10^{-19}$ Coulomb, and 0.75 volt is added to the flat band voltage to account for the parasitic voltage drop in the inversion layer in the substrate for negative applied gate voltages. The buried oxide capacitance is given by $C_{OX}=\epsilon_{OX}/T_{OX}$, where $\epsilon_{OX}$ is the dielectric constant of the oxide; and $T_{OX}$ is the buried oxide thickness.

From the slope of the transfer curve 22, the low field mobility for holes in the Si layer is given by: $\mu_{OH}$=(slope of $I_{DS}/G_M^{1/2})^2/[(W/L)C_{OX} V_{DS}]$, where W is the width of the FET; L is the channel length; $V_{DS}$ is the drain voltage; and the slope is measured in the straight line segment of transfer curve 22. For positive gate voltages, the intercepts of drain currents 13 to 16 around the peak of the inversion transconductance 23 are known as the inversion threshold voltages $V_{TH}$. The slope of drain currents 13 to 16 for currents below knee 20 are known as the subthreshold slopes, give by $S_{SL}=(\ln 10)(d \ln I_{DS}/dV_G)^{-1}$. The doping level in the Si film can be determined from the flat band voltage and the inversion threshold voltage in accordance with the formula: $N_A=2C_{OX}[V_{TH}-0.15)-(V_{FB}+0.75)-2\Phi_F S_{SL}/\ln(10)kT/Q]/QT_{SI}$, where $\Phi_F$ is bulk potential and is equal to $\Phi_F=(kT/Q) \ln N_A/N_I$, kT/Q is the "thermal" voltage, equal to 0.0259 volt at room temperature, $T_{SI}$ is the thickness of the Si film, $N_I$ is the intrinsic concentration of holes and electrons that would be present if there were no doping impurity ions in the Si. The inversion threshold voltage is corrected for a parasitic voltage drop of 0.15 volt occurring in the substrate for positive applied gate voltages. The low field electron mobility is given by the slope of the transfer curve 24 measured for positive voltages: $\mu_{OE}$=(slope of $I_{DS}/G_M^{1/2})^2/[(W/L) C_{OX} V_{DS}]$, where the slope is measured in the straight line segment of transfer curve 24.

The interface state charge density at the surface 3 between the BOX and the Si layer is given by Q-DIT=$[S_{SL}C_{OX}/\ln(10)kT/Q]-(C_{OX}+C_{SI})$, where $C_{SI}=\epsilon_{SI}/T_{SI}$ and $\epsilon_{SI}$ is the dielectric constant of silicon.

Parasitic resistances in the measurement circuit can result in considerable errors in the derived low field mobilities. A method for correcting the derived values of low field mobility to obtain accurate values has been developed using the equation for the drain current versus gate voltage given by: $I_{DS}=C_{OX}(W/L)\mu_{OE}(V_G-V_{TH})V_{DS}/[1+\theta(V_G-V_{TH})]$, where the term $\theta$ describes the drop-off of the mobility as a function of the applied gate voltage (due to the electric field causing surface scattering of holes and electrons). This factor contains two terms, an intrinsic term due only to surface scattering and a parasitic term due to series resistance: $\theta=\theta_I+(W/L)C_{OX}\mu_{OE}R_S$, where $R_S$ represents the series resistance present in the measuring circuit between the source electrode and ground. The true mobility is obtained from the measured mobility using the measured value of $\theta$ compared to the intrinsic value $\theta_I$: $\mu_{OE}$(true)=$\mu_{OE}$(measured)$-(d\mu_{OE}$(measured)$/d\theta)(\theta-\theta_I)$. The slope (d $\mu_{OE}$(measured)/d$\theta$) has been determined for a large number of SOI devices by adding external series resistances and measuring the resulting values of $\mu_{OE}$(measured) and $\theta$. The slope has a value of 130 to 140 cm²/volt second. In practice, an average value of 135 is used.

Figure 5:
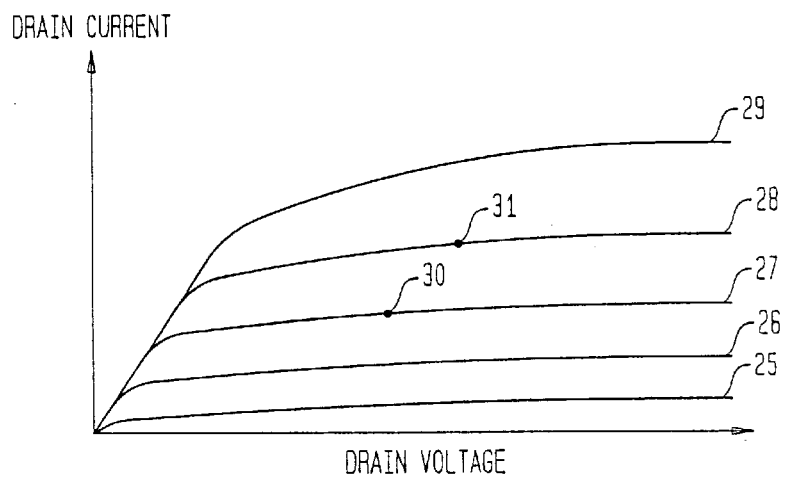
FIG. 5 is another graphical representation of drain current as a function of drain voltage of a device made according to the present invention.

The second type of current-voltage behavior for the FET device 7 of FIG. 2 is shown in FIG. 5 which plots drain current versus drain voltage at constant values of gate voltage. Since the current increases initially and then levels out with increasing drain voltage, the curves of FIG. 5 are referred to as the saturated current region. For example, curve 25 is the drain current versus voltage for a gate voltage just above the threshold voltage $V_{TH}$ of the device, while curve 29 is the drain current versus drain voltage for much higher gate voltages, and curves 26, 27 and 28 are for intermediate gate voltages in ascending order. The curves of FIG. 5 can be analyzed to obtain still more electrical parameters for the silicon film 2. The threshold voltage in the saturated region is found from the solution to the equation: $I_{DSAT2}/I_{SDAT1}=(V_{G2}-V_{THSAT})^2[1+\theta(V_{G1}-V_{THSAT})]/(V_{G1}-V_{THSAT})]^2[1+\theta(V_{G2}-V_{THSAT})]$ where $I_{DSAT1}$ and $I_{SDAT2}$ are the currents at two different gate voltages $V_{G1}$ and $V_{G2}$. For example, $I_{SDAT1}$ could be current denoted by 30 on curve 27 of FIG. 5 and $I_{DSAT2}$ could be the current denoted by 31 on curve 28 of FIG. 5, while the corresponding gate voltages are those used to produce curves 27 and 28. Two values of mobility can be obtained from these curves of FIG. 5. The mobility in the saturated region can be obtained from any of the curves 26 to 29 together with the corresponding gate voltage; for example: $\mu_{SAT}=I_{DSAT1}/(W/L)C_{OX}(V_{G1}V_{THSAT})^2$. Another mobility known as the effective mobility, $\mu_{EFF}$, is obtained from the linear region denoted by 32 in FIG. 5; $\mu_{EFF}=(dI_{DS}/dV_{DS})/(W/L)C_{OX}(V_G-V_{THSAT})$, where the current $I_{DS}$ and gate voltage $V_{GS}$ are obtained from any of the curves 26 to 29 in FIG. 5.

The low field mobility $\mu_{OE}$, the saturation mobility $\mu_{SAT}$, and the effective mobility $\mu_{EFF}$ differ from each other because the magnitude of the electric field in the silicon layer 2 is different in each case.

One other valuable electrical measurement obtained from the saturation curves of FIG. 5 is the slope of current versus voltage in the saturated region, known as the output conductance: $G_{OUT}=dI_{DS}/dV_{DS}$. This slope should be very low, corresponding to nearly flat curves. Typical values for measured output conductances are 5 to 20 microamps per volt, for example, in the device of FIG. 2. However, many samples exhibit output conductances greater than 50 when contamination is present in the silicon layer or when defects are present. The value of output conductance should be very low to insure good quality material.

The invention has been reduced to practice and used to measure the electrical parameters of the silicon layer in many silicon-on-insulator substrates for the purposes of quality control. A computer-controlled electrical measurement system has been established which delivers a set of files corresponding to the voltage-current behavior exhibited in FIGS. 3 and 5. A mathematical analysis algorithm has been developed which uses these voltage-current files as input and yields outputs of the electrical parameters such as the mobilities, transconductances, doping density, threshold voltages, BOX charge, interface state density, and output conductance mentioned herein above. While this algorithm has been developed using the MATHCAD software code, it is clear that anyone skilled in the programming arts can develop other analysis programs using the analysis equations presented herein.

The above embodiments are given to illustrate the scope and spirit of the present invention. These embodiments will make apparent, to those skilled in the art, other embodiments and examples. These other embodiments and examples are within the contemplation of the present invention. Therefore, the present invention should be limited only by the appended claims.

What is claimed is:

1. A method of determining electrical parameters of a silicon-on-insulator wafer comprising
   (a) removing a native oxide of a silicon layer surface of a silicon-on-insulator (b) contacting said silicon layer surface with two liquid metal electrodes;

(c) applying a voltage to an electrode on the bottom of said silicon-on-insulator wafer;

(d) measuring current between said two liquid metal electrodes for combinations of voltages between said liquid metal electrodes and said bottom voltage; and (e) analyzing resulting current-voltage behavior to obtain parameters of mobility, charge in the buried oxide of said silicon-on-insulator substrate, interface state charge, threshold voltages in the linear and saturated regions, doping density, transconductances and output conductances.

2. A method in accordance with claim 1 wherein said native oxide of said silicon layer is removed with an ethant.

3. A method in accordance with claim 2 wherein said etchant is hydrofluoric acid.

4. A method in accordance with claim 1 wherein said electrode on the bottom of said silicon-on-insulator wafer is formed by coating the bottom of said wafer with a deposited aluminum layer.

5. A method in accordance with claim 1 wherein said liquid metal of said layered metal electrodes disposed on said silicon layer surface is selected from the group consisting of mercury, gallium mixed with indium, tin and mercury combined with at least one metal such that the mixture is liquid at ambient temperatures.

6. A method in accordance with claim 5 wherein said liquid metal is mercury.

7. A method in accordance with claim 1 wherein said analysis step (e) includes application of correction factors to obtain said electrical parameters.

8. A method of determining electrical parameters of a silicon-on-insulator wafer comprising:

a) depositing an aluminum metal layer on the substrate surface of a silicon-on-insulator test sample;

b) forming a mesa of a silicon layer on a silicon layer surface of said test sample such that the edges of said silicon mesa are isolated from the edges of said test sample;

c) heat treating said test sample in an inert atmosphere at a temperature of 500° C. to 600° C.;

d) treating said silicon layer surface of said mesa in an aqueous hydrofluoric acid solution;

e) contacting said silicon layer surface of said mesa with two liquid metal electrodes;

f) applying a voltage to said aluminum metal layer of said substrate surface;

g) measuring the current between said two liquid metal electrodes for combinations of voltages between said liquid metal electrodes and said aluminum metal layer of said substrate surface; and h) analyzing resulting current-voltage behavior to obtain parameters of mobility, charge in the buried oxide of said silicon-on-insulator substrate, interface state charge, threshold voltages in the linear and saturated regions, doping density, transconductances and output conductances.

9. A method in accordance with claim 8 in which said liquid metal electrodes, disposed on said silicon layer surface, are selected from the group consisting of mercury, gallium, gallium mixed with indium or tin, mercury mixed with gallium, indium and tin, such that the mixture used is liquid at ambient temperature.

10. A method in accordance with claim 8 wherein said analysis step (h) includes application of correction factors to obtain said electrical parameters.

* * * * *